United States Patent
Vromans et al.

(10) Patent No.: US 8,451,886 B2
(45) Date of Patent: May 28, 2013

(54) APPARATUS METHOD AND COMPUTER READABLE MEDIUM FOR A TRANSMITTER

(75) Inventors: Jan S. Vromans, Maastricht (NL); Mark P. Van Der Heijden, Den Bosch (NL)

(73) Assignee: ST-Ericsson SA, Plan-les-Ouates (CH)

( * ) Notice: Subject to any disclaimer, the term of this patent is extended or adjusted under 35 U.S.C. 154(b) by 440 days.

(21) Appl. No.: 12/733,189

(22) PCT Filed: Aug. 18, 2008

(86) PCT No.: PCT/IB2008/053306
§ 371 (c)(1),
(2), (4) Date: Jul. 6, 2010

(87) PCT Pub. No.: WO2009/037603
PCT Pub. Date: Mar. 26, 2009

(65) Prior Publication Data
US 2010/0278228 A1 Nov. 4, 2010

(30) Foreign Application Priority Data
Aug. 16, 2007 (EP) .................................... 07114467

(51) Int. Cl.
*H03K 7/08* (2006.01)

(52) U.S. Cl.
USPC .......................................................... 375/238

(58) Field of Classification Search
USPC ............. 375/238, 295–297; 455/114.2–114.3
See application file for complete search history.

(56) References Cited

U.S. PATENT DOCUMENTS

| 6,813,319 B1* | 11/2004 | Nagle et al. .................. 375/302 |
| 7,551,688 B2* | 6/2009 | Matero et al. ................ 375/297 |
| 7,839,945 B2* | 11/2010 | Khojastepour et al. ....... 375/267 |
| 8,030,995 B2* | 10/2011 | Okubo et al. ................. 330/127 |
| 2003/0035554 A1* | 2/2003 | Cho et al. ..................... 381/94.5 |
| 2003/0112063 A1 | 6/2003 | Kenington |
| 2004/0222776 A1* | 11/2004 | Wu et al. ....................... 323/283 |
| 2005/0046474 A1* | 3/2005 | Matsumoto et al. ............ 330/10 |
| 2005/0152703 A1* | 7/2005 | Ogawa .......................... 398/189 |
| 2005/0164660 A1 | 7/2005 | Matsuura et al. |
| 2007/0291873 A1* | 12/2007 | Saito et al. .................... 375/298 |

FOREIGN PATENT DOCUMENTS

DE    10 2006 006875 B3    5/2007

OTHER PUBLICATIONS

Notification of Transmittal of the International Search Report and the Written Opinion of the International Searching Authority, or the Declaration dated Jun. 16, 2009 in connection with PCT Patent Application No. PCT/IB2008/053306.

* cited by examiner

Primary Examiner — Khanh C Tran
(74) Attorney, Agent, or Firm — Coats & Bennett, P.L.L.C.

(57) ABSTRACT

An apparatus comprising a signal generator for generating a polar representation of a signal. The apparatus comprises further a first filtering unit configured to filter a low frequency part of the amplitude component of said signal and a second filtering unit configured to filter a high frequency-part of the amplitude component of said signal. In addition, the apparatus includes a pulse width modulating unit configured to modulate the filtered high frequency part of the amplitude component of said signal together with the phase component of said signal. Finally the apparatus includes a DC-DC converter configured to convert the filtered low frequency part of the amplitude component of said signal. Said DC-DC converter supplies a switching mode power amplifier for amplifying the pulse width modulated signal.

26 Claims, 9 Drawing Sheets

APPARATUS METHOD AND COMPUTER READABLE MEDIUM FOR A TRANSMITTER

CROSS-REFERENCE TO RELATED APPLICATION(S)

The present application claims priority under 35 U.S.C. §365 to International Patent Application No. PCT/IB2008/053306 filed Aug. 18, 2008, entitled "APPARATUS, METHOD AND COMPUTER READABLE MEDIUM FOR A TRANSMITTER". International Patent Application No. PCT/IB2008/053306 claims priority under 35 U.S.C. §365 and/or 35 U.S.C. §119(a) to European Patent Application No. 07114467.9 filed Aug. 16, 2007 and which are incorporated herein by reference into the present disclosure as if fully set forth herein.

TECHNICAL FIELD

The application relates to an apparatus and method for modulating signals onto a carrier signal and a transmitter. Moreover, the application relates to a computer readable medium having a computer program stored thereon for modulating signals onto a carrier.

BACKGROUND OF THE INVENTION

In communication systems information comprising speech or other data is transmitted via a high frequency signal. For these communication systems communication signals are modulated from the base band onto a carrier signal via phase modulation, amplitude modulation or other modulation methods within a transmitter.

In general, at first a base band is generated comprising the information being transmitted. For increasing the transfer rate it is advantageously to use the amplitude component as well as the phase component as information carriers. After modulating the signal onto a carrier signal the signal may be amplified to a proper transmitting power.

It is very important to reduce power consumption of the used transmitters. In particular, the used power amplifiers, like class A or B amplifiers, dissipate much energy. Thus one method to realize reduction of power consumption is to make use of power amplifiers having a high efficiency, like switching amplifiers. For instance, class D or class E amplifiers can be used.

However, for employing switching amplifiers, suitable modulation methods are necessary since the switching amplifiers make high demands to linearity of the signal being amplified. Due to these high demands it is not possible to amplify a modulated signal which does not comprise a constant envelope directly. Thus appropriate modulation methods are needed, for instance, pulse width modulation (PWM) or pulse density modulation (PDM). However, these modulation methods encompass the disadvantage of a limited dynamic range.

For controlling a switching amplifier, several methods are known. According to one method, the input of the amplifier is driven with a two-level PWM signal, which is generated by comparing the modulated carrier signal with a triangular or saw tooth signal, which fundamental frequency is at least twice the carrier frequency.

Another possibility for driving a switching amplifier is to use a PWM signal which is generated by a band pass sigma-delta. However, these solutions offer the drawback of loss in bandwidth of the processed envelope modulation.

According to another class of solutions, the amplitude component is added via modulation of the supply voltage of the switching power amplifier. This modulation can be done via an efficient DC-DC converter. For instance, a DC-DC converter is combined with a linear regulator. However, it is difficult to achieve a high modulation bandwidth and to suppress unwanted noise or ripple generated by the DC-DC converter at the same time.

It is one object of the present application to provide reduced power consumption of the apparatus. A further object is to reduce unwanted noise and ripple generated by the DC-DC converter. A further object is to increase the dynamic range of the apparatus.

SUMMARY OF THE INVENTION

These and other objects are solved by an apparatus comprising a signal generator configured to generate a signal. The apparatus comprises a first filtering unit configured to filter a low frequency part of the signal and a second filtering unit configured to filter a high frequency part of the signal. The apparatus includes a pulse width modulating unit configured to modulate the filtered high frequency part of the signal. The apparatus encompasses a DC-DC converter configured to convert the filtered low frequency part of the signal.

The apparatus may be implemented within a transmitting device for transmitting any kind of information, like data, speech or the like. Furthermore, the apparatus can be implemented at least partially within a digital domain as well as within an analogue domain.

What is more, the apparatus comprises a signal generator. The signal generator creates a signal depending on the information being transmitted. For example, the generated signal is a base band signal.

Moreover, the low frequency part of the signal can be obtained by applying a suitable first filtering unit, like a low pass filter having an appropriate limiting frequency. The obtained low frequency part can be fed to a DC-DC converter.

In addition, the high frequency part of the signal can be obtained by the employed second filtering unit. This second filtering unit is configured to filter the high frequency part of the signal and the filtering unit comprises also at least one suitable limiting frequency. This signal can be fed to an arranged pulse width modulating unit. The signal comprising the information being transmitted can be modulated onto a desired carrier signal by this pulse width modulating unit. The advantage of a pulse width modulated signal is that the modulated signal comprises an almost constant envelope.

By using not only the low frequency part but also the high frequency part of the signal, the dynamic range can be improved.

According to one embodiment, the created signal may be a polar signal. A polar signal comprises generally an amplitude component and a phase component. The transfer rate can be increased due to the fact that both the amplitude component and the phase component can be used as information carriers. The polar signal can be split into an amplitude component and a phase component. The amplitude component is in accordance with the envelope of the polar signal.

In another embodiment the first filtering unit and the second filtering unit are arranged to filter the amplitude component of the polar signal. On the one hand the high frequency part and on the other hand the low frequency part of the amplitude component of the signal can be determined. Hence, fast changes of the amplitude component depending on the information being transmitted can be processed to achieve a high dynamic range.

Furthermore, the pulse width modulating unit may encompass a pulse position modulating unit. The phase component of the polar signal can be processed properly by the pulse position modulating unit. It may be advantageously to modulate the amplitude component and the phase component together onto a carrier signal within a same process step.

According to a further embodiment, an amplifying unit, in particular a switching amplifying unit, is arranged within the apparatus for reducing power consumption. A switching amplifying unit may encompass at least one input for the signal being amplified and at least one input for voltage supply. Such a switching unit can be employed in combination with suitable modulation methods, like pulse width modulation (PWM). The arranged pulse width modulating unit may perform pulse width modulation corresponding to the amplitude component and the arranged pulse position modulating unit may perform phase position modulation (PPM) corresponding to the phase component.

The DC-DC converter can be implemented for driving the amplifying unit. The amplifying unit can be driven by its supplying voltage depending on the low frequency part of the signal. The power consumption can be significantly reduced.

It is found, according to embodiments of the present application, that the limited dynamic range due to the use of PWM can be significantly improved by both applying the low frequency part of the signal, especially of the amplitude component, to control the supply voltage of the switching amplifying unit and using the high frequency part of the signal, in particular of the amplitude component, for generating a pulse width modulated signal being amplified.

The present apparatus according to embodiments may provide a significant power consumption reduction. What is more, unwanted noise and ripples generated by the DC-DC converter can be avoided and at the same time the dynamic range can be considerably improved.

It is further found according to embodiments that the modulated signal should be substantially linear for applying a switching amplifying unit. According to an embodiment of the present application the apparatus further comprises a converting unit. This converting unit may be configured to determine a phase shift function depending on the filtered high frequency part of the signal, for example of the amplitude component. For achieving a substantially linear signal, the converting unit may convert and bias the filtered high frequency part of the amplitude component into a suitable phase shift function containing the signal information, for example the amplitude component information. Furthermore, the converting unit may enable in an advantageous manner to calculate a proper phase shift function for further processing, like modulating the phase shift function via pulse width modulation onto a carrier signal.

By the way it is found that for the phase component of a polar signal a converting unit or the like is not essential due to the linear relation between the wanted phase modulation and the phase component.

Furthermore, it may be advantageously to implement the converting unit digitally. However, an analogue realization or a partially digital and analogue realization is also possible.

The converting unit may comprise a limiting unit. A limiting unit, like a clipper or the like, may limit an input signal adequately. Properly limiting the filtered high frequency part of the signal may yield to a smaller range without disregarding relevant portions and thus, it yields to fewer requirements on the following devices. The calculating time can also be reduced. A suitable limiting of the high frequency part can be obtained by taking physical limitation into account. For example, a minimum value of the high frequency part can be adjusted by taking the physical limitation of the switching amplifying unit into account. The maximum value of the high frequency part can be adjusted, for instance, since the slope of a duty cycle run is very low for large amplitude values. Other factors for adjusting the range of the high frequency part of the signal can also form the basis.

Moreover, the converting unit may comprise a first determining unit to determine a first duty cycle function depending on the filtered high frequency part especially of the amplitude component. According to the present application it is found that the desired phase shift function may depend on the duty cycle. The duty cycle depending in turn on the limited high frequency part may be calculated according to an implemented suitable algorithm. For example, the first duty cycle can be calculated by the arcsine function used on the high frequency part and a constant multiplication factor. The found dependency of the duty cycle and the high frequency part may enable an implementation with low effort.

In addition, the converting unit may include an addition unit configured to determine a second duty cycle function depending on the first duty cycle function and an average duty cycle factor. The average duty cycle factor may be calculated before the apparatus is put into operation. For calculating the average duty cycle factor, at first the average value of the high frequency part in particular of the amplitude component may be determined by taking the maximum and minimum values of the high frequency part of the amplitude component into account. Advantageously, normalized values can be used. The average duty cycle factor can be obtained using the above-mentioned algorithm. Other possibilities to determine the average duty cycle factor are conceivable.

The addition of the average duty cycle factor and of the determined first duty cycle function may yield controlling the duty cycle of the pulse width modulating unit by the average duty cycle factor in case no high frequency parts are within the amplitude component. For the other case, a variation induced by the first duty cycle function around the average duty cycle factor may be achieved. Fast changes of the amplitude component can be regarded.

The converting unit may also comprise a second determining unit for determining the desired phase shift function depending on the second duty cycle function. It is found that the phase shift function depends linearly on the obtained second duty cycle function taken additionally the maximum constant phase shift into account. Thus the needed algorithm can easily be implemented.

The pulse width modulating unit may also comprise the pulse position modulating unit. For simplicity reasons, such a combination may be called pulse width-pulse position modulating unit. However, it is understood that all further embodiments may also be implemented without a pulse position modulating unit.

According to a further embodiment of the present application the pulse width-pulse position modulating unit may comprise a mapping unit configured to map the determined phase shift function and/or the phase component of the polar signal to at least one suitable function according to a chosen implementation of the pulse width-pulse position modulating unit. Suitable functions may be trigonometric functions, like sine and/or cosine functions. The input signals of the mapping unit, like the phase component and/or the phase shift function may be mapped onto at least one of the above mentioned functions. There are several options for mapping, like using a CORDIC algorithm or a ROM table. The use of such options may reduce computing expenditure. The mapping unit may be realized digitally. However, an analogue implementation may be possible as well.

For generating a modulated signal having the information being transmitted a modulating unit may be arranged within the pulse width-pulse position modulating unit. This unit may be arranged for modulating the information included in the phase shift function and phase component and the suitable mentioned function, respectively, onto a carrier signal.

A signal having any suitable frequency can be used as a carrier signal. A voltage control oscillator (VCO), a voltage controlled crystal oscillators (VCXO) or the like may generate the carrier signal.

According to another embodiment of the present application the modulating unit may comprise several calculating units and/or logic units to modulate the input signals, like the phase shift function and phase component onto a carrier signal. For instance, the modulating unit may comprise at least one multiplying unit and/or at least one addition unit and/or at least one signum unit and/or at least one NOR unit and/or at least one AND unit. However, other arrangements comprising other logic and/or calculating units are possible.

Generally there are several methods to generate a pulse width modulated signal like using a saw or triangular signal. It is found that a pulse width modulated signal can be created with the aid of two opposite shifted carrier signals. The carrier signal may be opposite shifted at least by the determined phase shift function. The two opposite shifted carrier signals may be obtained by a calculating network comprising calculating units like, multiplier, summer and/or signum units. Depending on the phase component, the two carrier signals may be shifted additionally into same direction.

An arrangement comprising logic functions can be used to compute the desired modulated signal. For example, the two opposite shifted functions may be gated NOR and AND. The resulting two functions can directly be fed to the switching amplifying unit. Another possibility is that one signal may be firstly inverted and then added to the other signal. The resulted signal can be fed to the switching amplifying unit. The determined modulated signal is suitable for amplifying by a switching amplifying unit.

It is understood in this connection that other realizations of the modulating unit are conceivable, as well. However, the proposed implementation offers the advantage to be easily implementable without high effort. The modulating unit may be realized analogue.

For further improving the linearity the apparatus according to one embodiment of the application may additionally comprise a feedback loop path. A feedback loop may be used to correct the signal depending on an amplified signal. In general, the feedback loop can be implemented entirely within the analogue domain which may be called short or local feedback loop, as well as at least partly within the digital domain which may be called long feedback loop. Correction of the polar signal within the digital domain can easily be performed. The advantage of an implementation within the analogue domain may be that a bandwidth limitation can be avoided.

For correcting the signal, for example the polar signal, depending on the amplified signal, an amplitude and/or phase detector unit can be arranged at the output of the amplifying unit for detecting an amplitude component and/or phase component of the amplified signal. Due to the fact that the signal being modulated may be split into an amplitude component and a phase component at least one of the corresponding components of the amplified signal may be detected. However, it may be advantageously to detect both the amplitude component and phase component of the amplified signal for correcting the respective components of the polar signal. An improved result can be achieved.

The amplitude and/or phase detector unit may be realized entirely within the analogue domain or at least partly within the digital domain. The realization may depend on the chosen feedback loop according to the above-mentioned possibilities.

Furthermore, a first comparing unit may be provided within the apparatus according to a further embodiment. The first comparing unit may compare the detected amplitude component of the amplified signal with the amplitude component generated by the signal generator. A comparator or the like can be used as a comparing unit. The comparing unit can be implemented digitally or analogue which may depend on the chosen feedback loop. In the digital domain the comparing unit may be arranged previous to the filtering units. If the comparing unit is realized analogue it may be advantageously to realize the low pass filtering unit analogue and to implement an additional second band pass or high pass filtering unit. However, several possibilities for implementation are possible.

An obtained error signal of the amplitude component may also be split into a low frequency part and a high frequency part, as explained above. For an analogue realization correcting the high frequency part of the amplitude component may be performed after conversion and predistortion. An improved linearity can be achieved.

According to a further embodiment, the apparatus may comprise a second comparing unit. For a second comparing unit a comparator or the like may be employed, to compare the detected phase component of the amplified signal with the phase component generated by the signal generator. In general the comparing unit may be implemented digitally as well as in an analogue way.

In addition, the apparatus according to the present application may further comprise an integrator unit. The integrator unit can be arranged following the second comparing unit. Further the integrator unit may be used for correcting the phase component depending on the compared phase signal by the second comparing unit. The corrected phase component can be fed to the pulse width-pulse position modulating unit. The combination of the second comparing unit and the integrator unit may yield to a good result with low effort. Advantageously both the second comparing unit and the integrator unit are implemented digitally.

In another embodiment of the application a phase error signal obtaining unit having at least one multiplying unit and an integrator unit may be employed within the apparatus. The phase error signal obtaining unit may be realized in an analogue way.

The apparatus according to the present application may include a second filtering unit wherein the filtering unit is at least a high pass filter or a band bass filter. Such filtering units are suited to filter the desired high frequency part of the signal, in particular of the amplitude component. Such filtering types can easily be implemented within the digital domain as well as within the analogue domain. A band pass filtering unit may be in particular suitable owing to its possibility to filter only within a defined frequency range. For example, occurring disturbances within another frequency range do not affect further processing steps.

According to one embodiment of the application the switching amplifying unit may be a class D or class E amplifier. These types of power amplifiers are especially suitable due to their small power consumption. However, similar amplifying devices can also be implemented into the apparatus according to the application.

Another aspect of the present application is a method comprising generating a signal. The method includes filtering a low frequency part of the signal and filtering a high frequency part of the signal. The method encompasses also modulating the filtered high frequency part of the signal. The method includes converting the filtered low frequency part of the signal.

A further aspect of the present application is a computer readable medium having a computer program stored thereon. The computer program comprises instructions operable to cause a processor to perform at least the above-mentioned method.

The present application can be deployed in several application areas which include efficient modulated transmitters. The transmitters can be used for WLAN, WPAN, Bluetooth, OFDM, GSM, UMTS, CDMA, low power mobile communication devices and the like.

It should be denoted that only elements relevant to the principle of the present application are explained above. Components, like delay elements or analog digital converter are omitted. However, a person skilled in the art is able to implement such components if the components are needed.

These and other aspects of the present patent application become apparent from and will be elucidated with reference to the following Figures. The features of the present application and of its exemplary embodiments as presented above are understood to be disclosed also in all possible combinations with each other.

DETAILED DESCRIPTION OF THE DRAWINGS

In the following detailed description of the present application, exemplary embodiments of the present application will describe and point out the architecture of the apparatus which make it possible to reduce power consumption. Furthermore, it will be elucidated by the exemplary embodiments to suppress the unwanted noise or ripple generated by the DC-DC converter without loss in bandwidth of the processed modulation.

Figure 1:
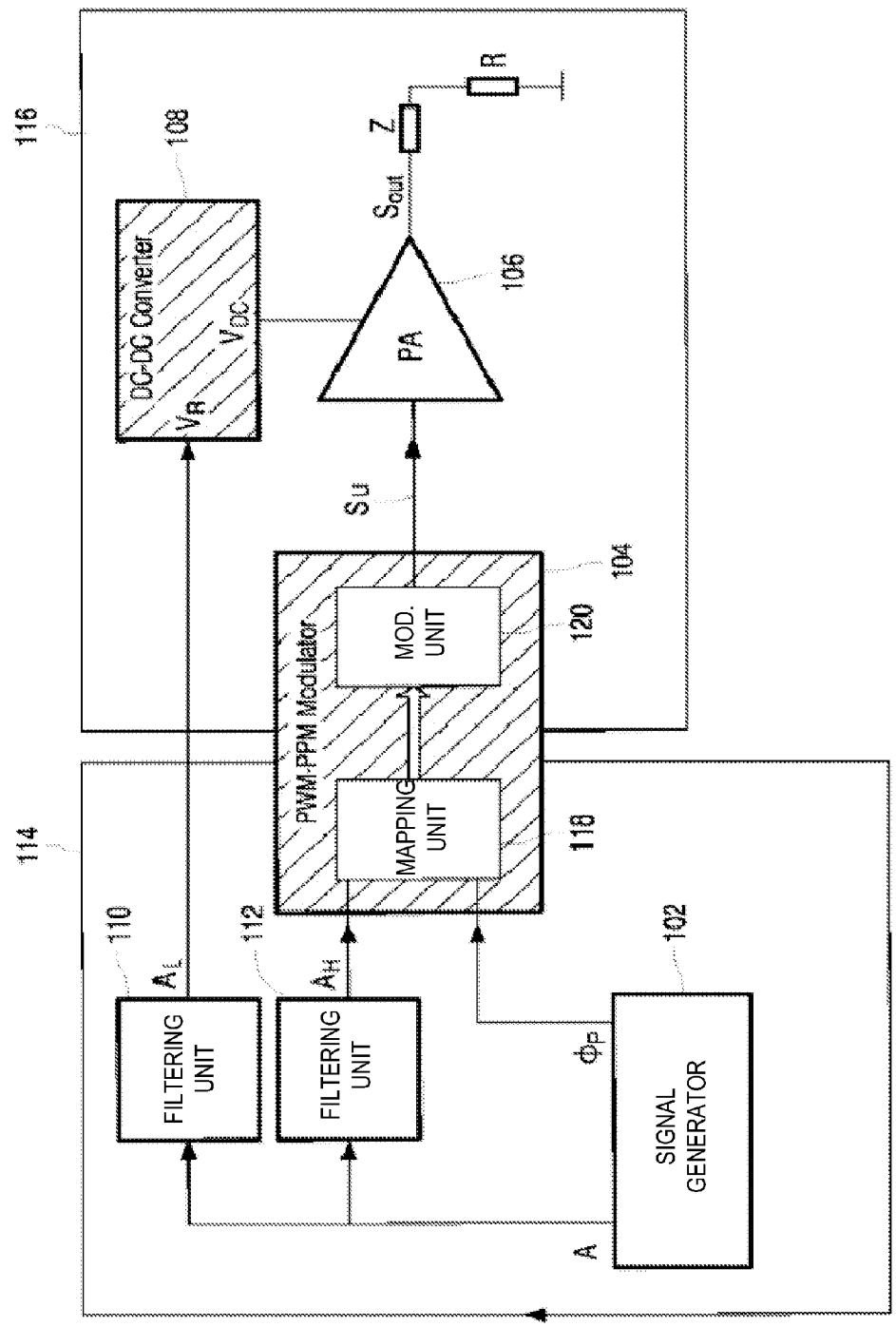
FIG. 1 a first embodiment of the apparatus according to the application.

FIG. 1 shows an exemplary simplified embodiment of the apparatus according to the present application. At first, the shown embodiment may be divided into a digital domain 114 and an analogue domain 116. There are several other possibilities for dividing the illustrated embodiment into the digital domain 114 and analogue domain 116. According to this embodiment the digital domain comprises at least a signal generator 102, a first filtering unit 110, a second filtering unit 112 and a mapping unit 118 of a pulse width-pulse position (PWM-PPM) modulating unit 104. The pulse width-pulse position modulating unit is arranged as one device. However, pulse width modulating unit and pulse position modulating unit can be implemented separated to each other, as well.

In addition, the analogue domain 116 includes at least a modulating unit 120 of the PWM-PPM modulating unit 104, a DC-DC converter 108 and an amplifying unit 106, in particular a switching amplifying unit 106, whereby an impedance Z and a resistance R are arranged at the output of the switching amplifying unit 106. The switching amplifying unit 106 may be a class D amplifier, class E amplifier or a similar amplifying unit. These types of amplifiers offer the advantage to be very efficiently.

The signal generator 102 depicted in this embodiment generates a base band polar signal. However, other signals are possible. This polar signal comprises an amplitude component A and a phase component $\Phi_P$. Both are used as information carriers. The phase component $\Phi_p$ is fed to one input of at least two inputs of the mapping unit 118 of the PWM-PPM modulating unit 104.

The amplitude component A, also called the envelope signal A, is split into an amplitude signal $A_L$ corresponding with the low frequency content of the original envelope signal A and into an amplitude signal $A_H$ corresponding with the low frequency content of the original envelope signal A.

For obtaining the amplitude signal $A_L$ a first filtering unit 110 can be arranged for low pass filtering having a suitable limiting frequency. The other signal $A_H$ can also be obtained by an arranged second filtering unit 112, like a high pass filter or a band pass filter comprising suitable limiting frequency/ies.

Then the high frequency signal $A_H$ is fed to a second input of the mapping unit 118 of the PWM-PPM modulating unit 104. The mapping unit 118 may be configured to map the input variables to proper functions for following modulating operations. The CORDIC algorithm, a ROM table or other appropriate methods can be implemented for mapping to reduce calculating time. There are several possibilities for an implementation of the depicted PWM-PPM modulating unit 104. An elucidation of one embodiment of the PWM-PPM modulating unit 104 according to the present application occurs subsequently.

Depending on both the phase component $\Phi_P$ and signal $A_H$ a signal $S_M$ is modulated which is suitable to be amplified by the arranged switching amplifying unit 106. The signal is a pulse width modulated signal which is suitable for the employed class D or class E amplifier. The modulated signal $S_M$ is fed to the switching amplifying unit 106 for amplifying the signal $S_M$ to a desired transmitting power.

The signal $A_L$ is fed to the DC-DC converter to control appropriately the switching amplifying unit 106 by the supply voltage $V_{DC}$. In the case the amplitude signal $A_L$ is zero the switching amplifying unit 106 may be not supplied with a voltage. As result of the shown arrangement in FIG. 1 the desired amplified signal $S_{out}$ is impressed at the output of the switching amplifying unit 106.

According to this embodiment it is possible to suppress the unwanted noise or ripple generated by the DC-DC converter without loss in bandwidth of the processed modulation.

For clearance reasons possibly necessary components, like delay elements, analog digital converters or the like are omitted. However, a person skilled in the art is able to implement such components if needed.

Figure 2:
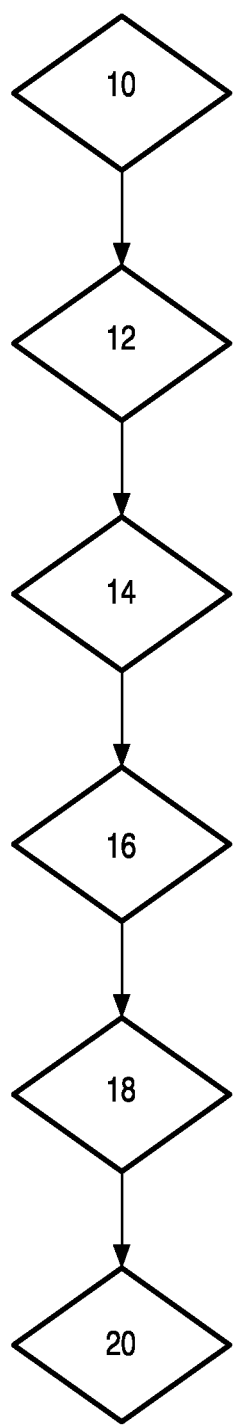
FIG. 2 an exemplary flowchart of a method according to the application.

In FIG. 2 an exemplary flowchart of a method according to the application is depicted to demonstrate its functioning in general.

In the first step 10 the signal generator creates a signal, especially a polar signal including an amplitude component A and a phase component $\Phi_P$, depending on the information which should be transmitted, like speech or other data.

In the following step 12 the signal, especially the amplitude component A, is low pass filtered by the first filtering unit 110.

Then in step 14 the high frequency part of the signal, in particular the amplitude component A, is filtered by the second filtering unit 112. Filtering may be done by a high pass or a band pass filtering unit 112, 112a. Generally steps 12 and 14 may be performed at the same time.

The filtered high frequency part $A_H$ and the phase component $\Phi_P$ are fed to the PWM-PPM modulating unit 104 and are modulated onto a suitable carrier signal in the next step 16.

In the following step 18 the switching amplifying unit 106 is controlled by the DC-DC converter 108 depending on the low pass filtered amplitude component $A_L$. The DC-DC converter 108 drives the supply voltage $V_{DC}$ of the switching amplifying unit 106.

In the last step 20 the modulated signal $S_M$ is amplified by the switching amplifying unit 106. It is readable clear that the modulated signal $S_M$ and the signal $A_L$ used to drive the switching amplifying unit 106 must synchronized in time properly. Low power consumption is also achieved as suppressing noise and improving the dynamic range according to the described method.

A transmitter should offer a good linearity for the case a switching amplifier, like a class D or E amplifier, is used for reducing power consumption. Pulse width modulated signals are suitable to obtain a good linearity.

Figure 3:
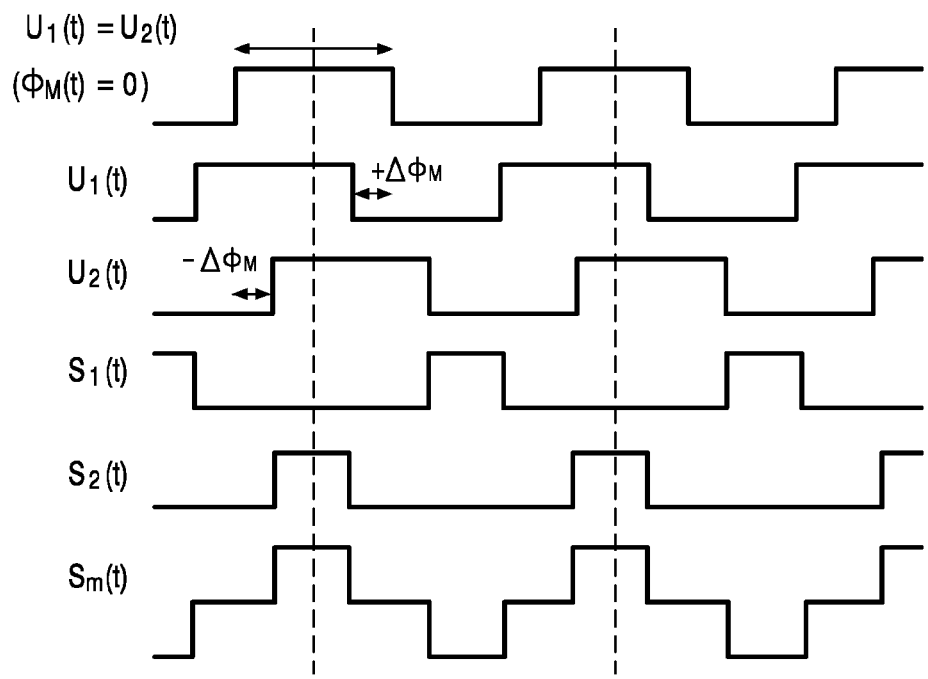
FIG. 3 a first exemplary diagram to create a pulse width modulated signal.

There are several methods to generate a pulse width modulated (PWM) signal, like applying a saw or triangular signal. The present method and the apparatus for performing the respective method are especially suitable to control a switching amplifying unit 106. A PWM signal can be done with the aid of two opposite shifted carriers. FIG. 3 shows signals $u_1(t)$ and $u_2(t)$ which are opposite phase shifted by $\Delta\Phi_M$.

The phase shift signal or function $\Phi_M(t)$ includes the information of the amplitude component being transmitted. For simplification reasons only a constant phase shift $\Delta\Phi_M$ is shown according to FIGS. 3 and 4. It will be explained subsequently how the phase shift signal $\Phi_M(t)$ can be obtained.

The illustrated signal $s_1(t)$ can be obtained using a NOR function of the opposite phase shifted signals $u_1(t)$ and $u_2(t)$. The second signal $s_2(t)$ can be determined by an AND function of the signals $u_1(t)$ and $u_2(t)$. The desired signal $S_m(t)$ is obtained by superimposing the inverted signal $s_1(t)$ and the signal $s_2(t)$. Use of other logical functions for obtaining the desired modulated signal $S_m(t)$ is conceivable.

Figure 4:
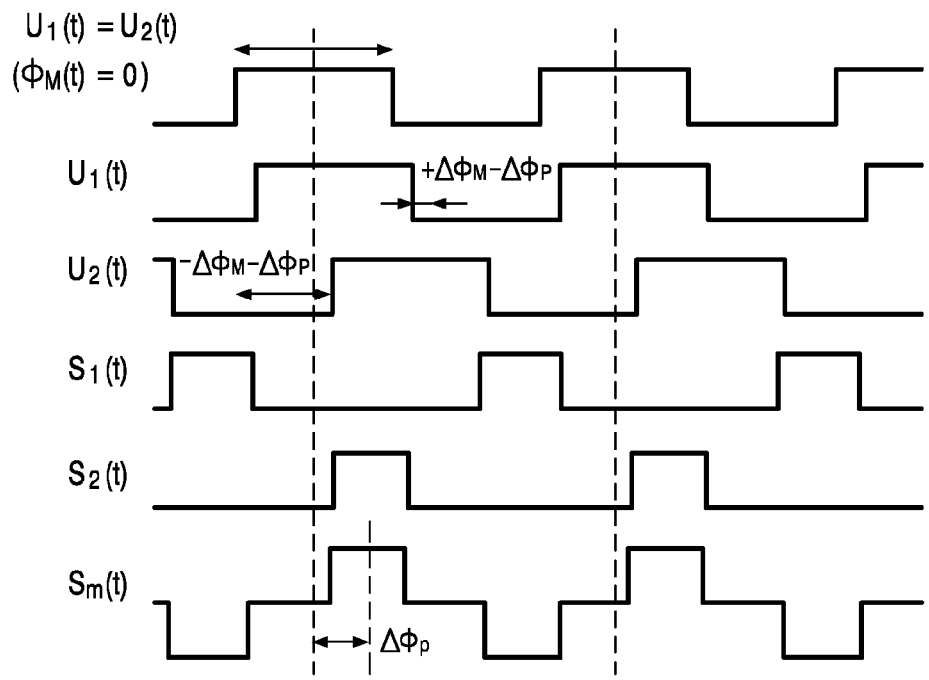
FIG. 4 a second exemplary diagram to create a pulse width modulated signal having an additional phase shift depending on the pulse position modulation.

FIG. 4 shows similar signals. The difference between the two diagrams according to FIGS. 3 and 4 is an additional phase shift $\Delta\Phi_P$ depending on a PPM modulation of the phase component $\Phi_P$.

Figure 5:
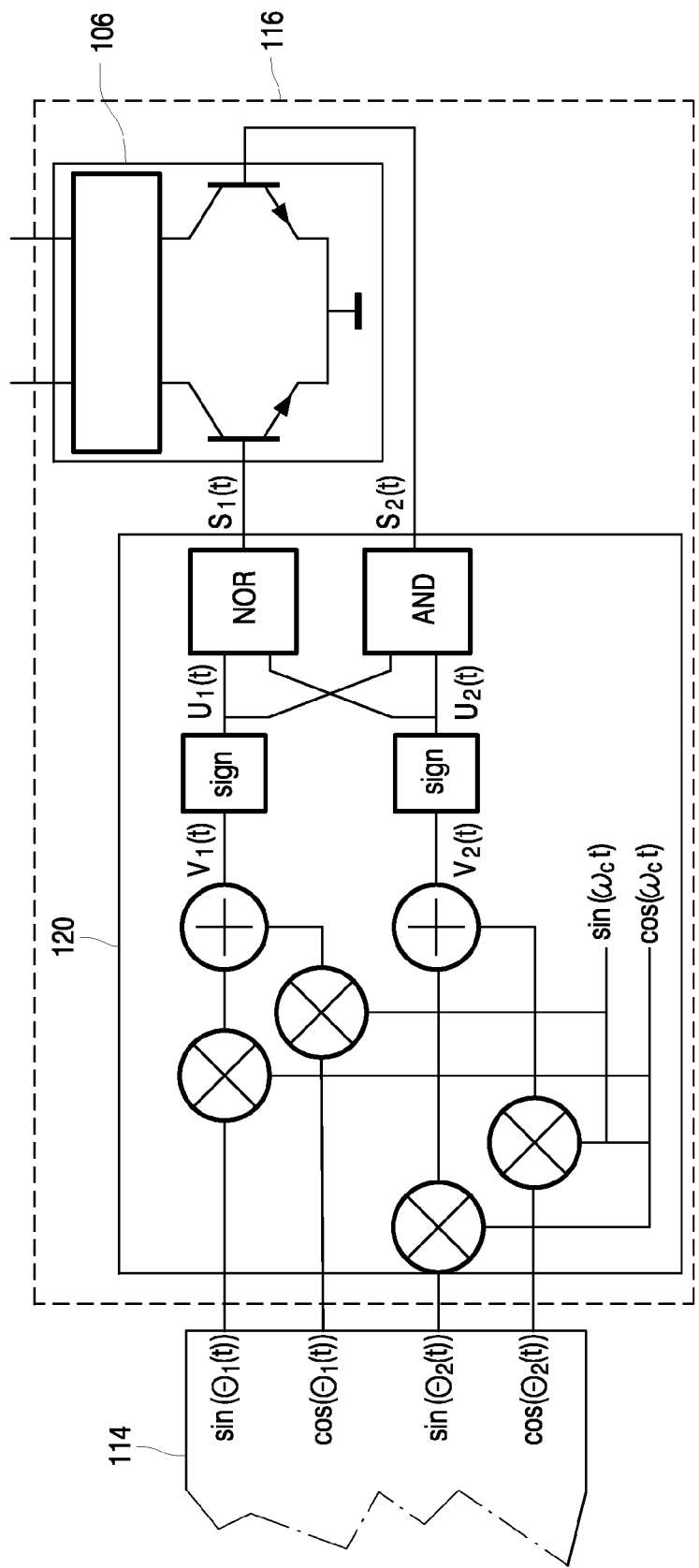
FIG. 5 an embodiment of the modulating unit of the pulse width modulating unit comprising a pulse position modulating unit according to the application.

In FIG. 5 an embodiment of the modulating unit 120 of the PWM unit comprising a PPM unit according to the present application is illustrated. The shown PWM-PPM modulating unit can be divided into the digital domain 114 and the analogue domain 116. Other divisions are conceivable. Not shown in FIG. 5 is the mapping unit 118 which provides the four functions $\sin(\Theta_1(t))$, $\cos(\Theta_1(t))$, $\sin(\Theta_2(t))$, $\cos(\Theta_2(t))$ whereby:

$\Theta_1(t)=\Phi_P(t)+\Phi_M(t)$ and $\Theta_2(t)=\Phi_P(t)-\Phi_M(t)$.

These four trigonometric functions are fed to the modulating unit 120 arranged within the analogue domain 116. According to the present embodiment the modulating unit 120 comprises four multiplying units, two addition units, two signum units, a NOR gate and an AND gate. However, different implementations comprising other calculating and logical units are possible. For lucidity reasons the needed at least one carrier signal generator, for instance a voltage control oscillator (VCO), is not shown in FIG. 4. Illustrated are only two input signals $\sin(\omega_C t)$ and $\cos(\omega_C t)$ corresponding to the carrier frequency $\omega_C$.

In the following the functioning of the modulating unit 120 is pointed out.

At first, the six trigonometric functions mentioned above are taken to calculating operations, like multiplying and adding in the depicted way according to FIG. 5. As results the following two functions are obtained $v_1(t)=\sin(\omega_C t+\Phi_P(t)+\Phi_M(t))$ and $v_2(t)=\sin(\omega_C t+\Phi_P(t)-\Phi_M(t))$.

The functions $v_1(t)$ and $v_2(t)$ are opposite phase shifted. In the next step the two functions are fed to a signum function or a limiter which results in two phase modulated two level signals given by $u_1(t)=\text{sign}(\sin(\omega_C t+\Phi_P(t)+\Phi_M(t)))$ and $u_2(t)=\text{sign}(\sin(\omega_C t+\Phi_P(t)-\Phi_M(t)))$.

These signals $u_1(t)$ and $u_2(t)$ are the desired opposite phase shifted two level signals. These signals can be used to construct a varying pulse width. Finally the signal $S_m(t)$ including signals $s_1(t)$ and $s_2(t)$ are created by using a NOR and an AND function resulting in $s_1(t)=u_1(t)\overline{\cup}u_2(t)$ and $s_2(t)=u_1(t)\cap u_2(t)$.

These output functions $s_1$ and $s_2$ which are especially suitable for switching amplifiers are fed to the switching amplifying unit 106. The switching amplifying unit 106 may comprise two transistors as shown in FIG. 5. Other layouts of the switching amplifying unit 106 are conceivable as well as generating firstly one signal $S_M$ being amplified.

Figure 6:
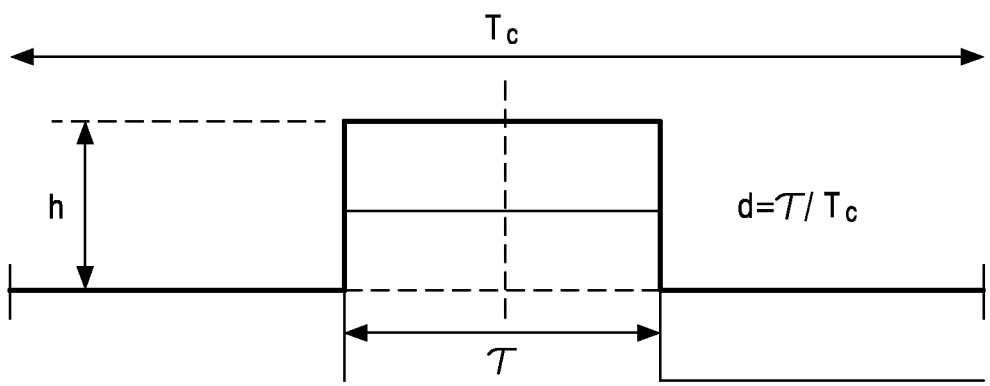
FIG. 6 an exemplary diagram of a pulse.
Figure 7:
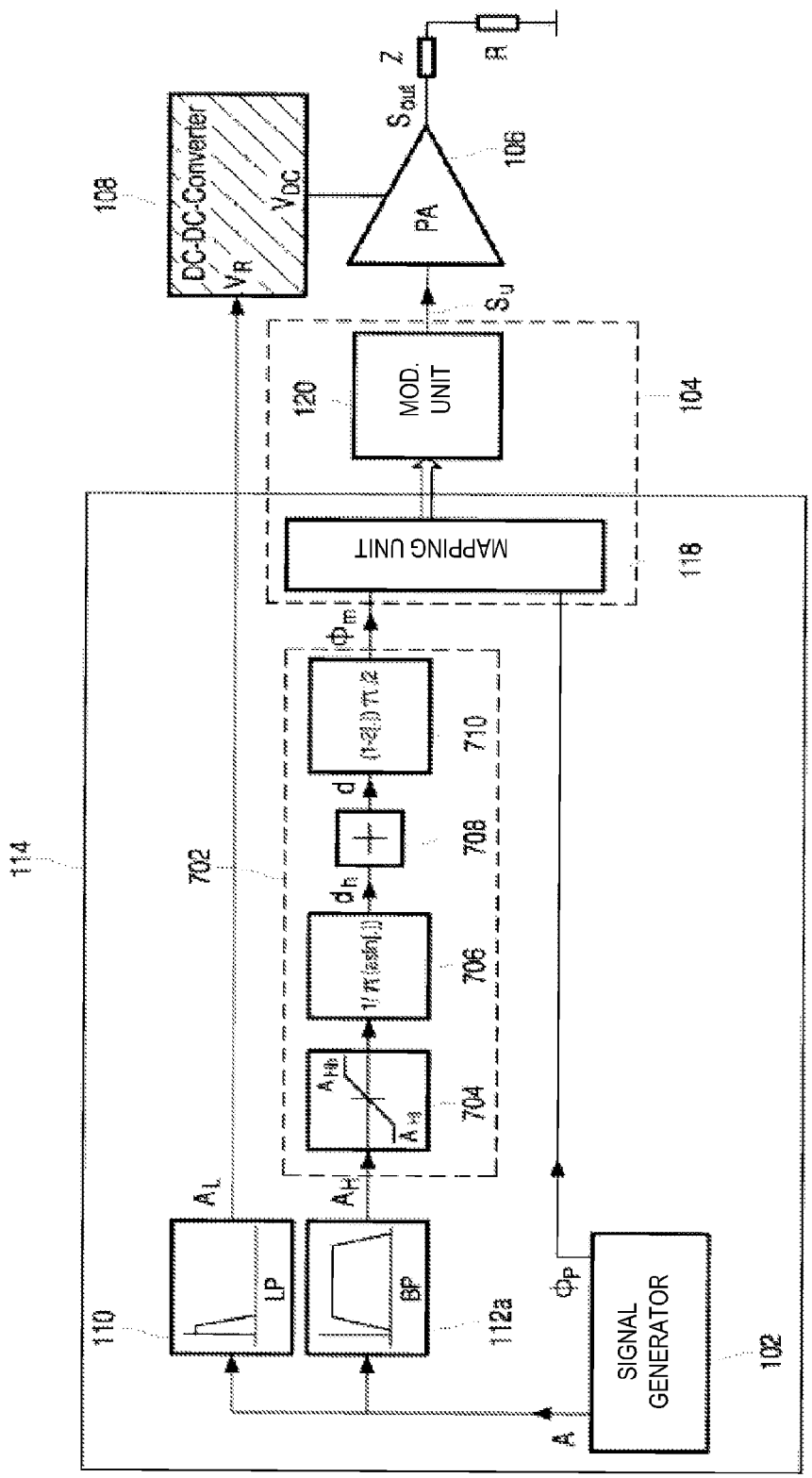
FIG. 7 a second embodiment of the apparatus according to the application.
Figure 8:
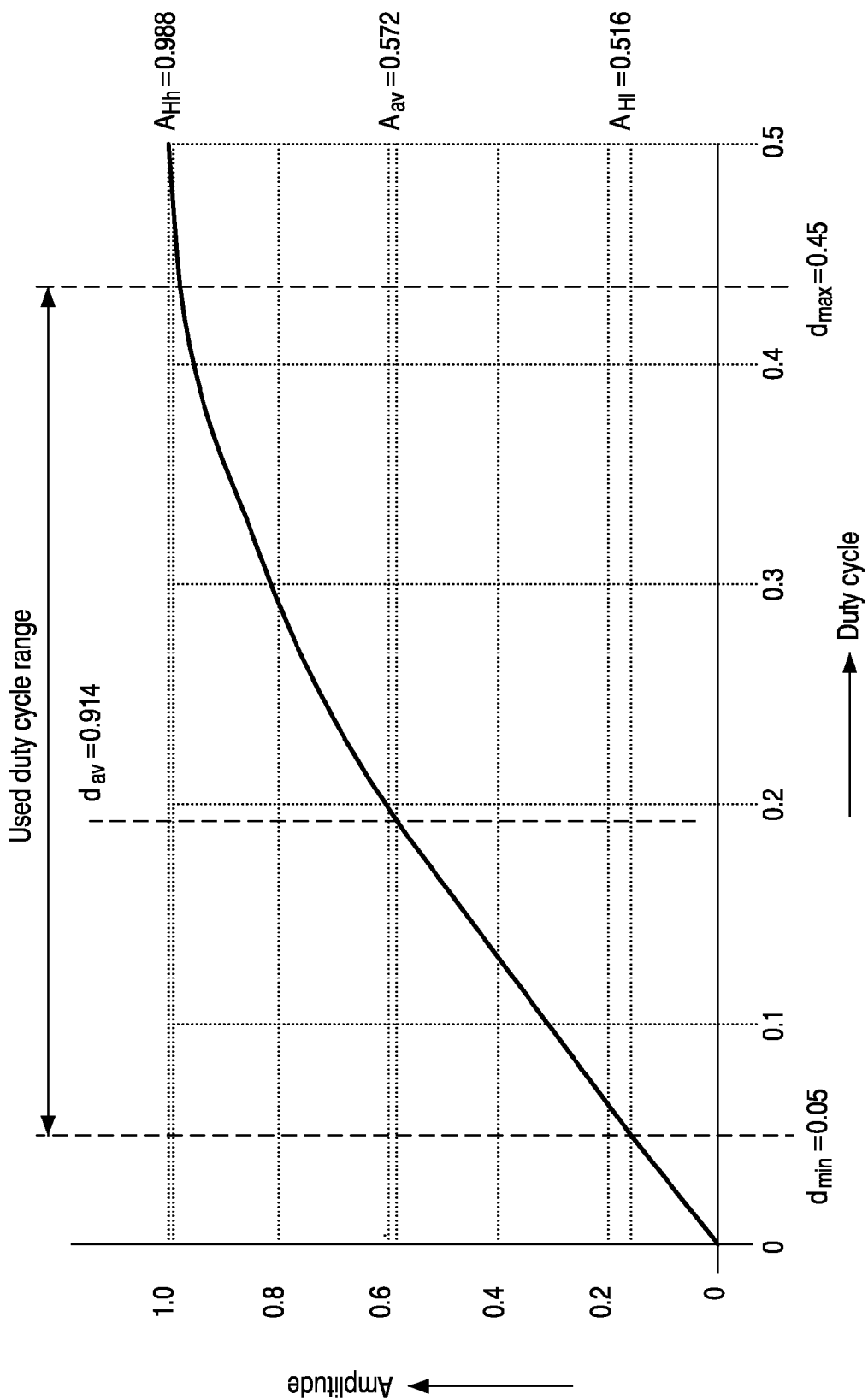
FIG. 8 an exemplary diagram of a run of the duty cycle depending on high frequency part of an amplitude component of a polar signal.

By the aid of the following FIGS. 6 to 8 it will be elucidated how the desired phase shift function $\Phi_M(t)$ which represents the amplitude information is determined.

In FIG. 6 an exemplary diagram of a pulse is shown. The depicted pulse has a pulse length $\tau$ and a height h within a period $T_C$ corresponding to the carrier frequency $\omega_C$. Thus the duty cycle is $d=\tau/T_C$. Through Fourier series expansion the following equitation can be obtained $$f(t) = \frac{\tau h}{T_C} + \frac{2h}{\pi}\left[\sin\left(\frac{\tau}{T_C}\pi\right)\cos(\omega_C t) + \frac{1}{2}\sin\left(\frac{2\tau}{T_C}\pi\right)\cos(2\omega_C t) + \frac{1}{3}\sin\left(\frac{3\tau}{T_C}\pi\right)\cos(3\omega_C t) + \ldots\right]$$

Substitution of the duty cycle d and conversion of the function f(t) into a sum yield to $$f(t) = dh + \frac{2h}{\pi}\sum_{n=1}^{\infty}\frac{\sin(nd\pi)}{n}\cos(n\omega_C t).$$

This function represents the relation between the amplitudes of the fundamental frequency and its harmonics depending on the duty cycle d. The amplitude $A_n$ of the $n^{th}$ harmonic of the fundamental frequency as a function of the duty cycle is then given by $$A_n = \frac{2h}{\pi} \frac{\sin(nd\pi)}{n}.$$

$A_n$ reaches its maximum value $$A_{n,max} = \frac{2h}{\pi n}$$

for a duty cycle value $$d = \frac{1}{2n}.$$

According to the present application it has been found that for the applied PWM modulation method a continuously decreasing or increasing function $A_n(d)$ is needed. The range of the duty cycle d and thus the range of the amplitude $A_1$ representing the amplitude of the first harmonic are $$d \Rightarrow 0 \ldots 0.5 \text{ and } A_1 \Rightarrow 0 \ldots \frac{2}{\pi}.$$

Function $A_1$ is a continuously increasing or decreasing function. It is further found, according to the present application, that an amplitude change of the $n^{th}$ harmonic of the pulse train may occur according to the next equitation $$d = \frac{1}{n\pi} \arcsin\left(\frac{n\pi A_n}{2h}\right).$$

The duty cycle d of the first harmonic signal is achieved by substitution of n=1 and h=1

$$d = \frac{1}{\pi} \arcsin\left(\frac{\pi A_1}{2}\right).$$

An envelope signal which may be normalized in the range from 0 to $2\pi$ will result in a linear AM modulation of the first harmonic fundamental of the pulse width modulated signal. It may be suitable to normalize the amplitude $A_{norm}$ to the range from 0 to 1 and as the final predistortion function $$d(t) = \frac{1}{\pi} \arcsin(A_{norm}(t))$$

is achieved. Thus a duty cycle function d(t) is obtained for the applied PWM-PPM modulation unit 104.

As may be seen from FIG. 3 the maximum phase shift is given by $$\hat{\Phi}_M = \frac{\pi}{2}$$

The desired phase shift function $\Phi_M(t)$ can also be derived from FIG. 3. Depending on the duty cycle d(t) and the maximum phase shift $\hat{\Phi}_M$ the searched function $\Phi_M(t)$ is given by $$\Phi_M(t) = (1-2d(t))\hat{\Phi}_M.$$

This function $\Phi_M(t)$ which comprises the amplitude information being transmitted is suitable for the applied PWM modulation.

For the additional PPM modulation a predistortion and conversion is not needed due to the linear relation between the wanted phase modulation $\Phi_P(t)$ and the phase component. Thus $\Phi_P(t)$ is given by the following equitation $$\Phi_P(t) = \arg(s_{baseband}(t)).$$

In FIG. 7 a second embodiment of the present apparatus is illustrated according to the above deduced method for determining the desired phase shift signal $\Phi_M(t)$.

The already known components are not explained again and hold the same reference signs. As filtering unit 112 a band pass filtering unit 112a is installed. A band pass filtering unit 112a can be used for suitable limiting the high frequency part $A_H$.

Further a converting unit 702 is arranged within the digital domain 114 for converting and predistortion of the high frequency signal $A_H$. In turn the converting unit 702 includes several units, like a limiting unit 702 for limiting the signal $A_H$. Furthermore, the shown converting unit 702 comprises a first determining unit 706 for obtaining the first duty cycle $d_h$ and a second determining unit 710 for determining the desired phase shift function $\Phi_M(t)$. Between the two determining units 706, 710 an addition unit 708 is arranged.

The functioning of the converting unit 702 is explained in the following.

After passing the limiting unit 704, for instance a clipper, signal $A_H$ is fed to the first determining unit 706. The first duty cycle $d_h$ is calculated within the determining unit 706 according to the function $$d_h = \frac{1}{\pi}\arcsin(A_{liH}),$$

whereby signal $A_{liH}$ is the limited signal corresponding to $A_H$.

The predetermined average value of the duty cycle $d_{av}$ is added to the determined first duty cycle $d_h$ with the aid of the addition unit 708. The reason of adding the average value of the duty cycle $d_{av}$ is that whether there are zero high frequency parts the duty cycle the PWM modulating unit will be controlled to this average value $d_{av}$. In the case of high frequency parts the signal $A_H$ converted to $d_h$ gives a variations around the average duty cycle $d_{av}$. Determining the average duty cycle $d_{av}$ will be elucidated subsequently with the aid of FIG. 8.

The achieved second duty cycle d is forwarded to the second determining unit 710 to calculate the desired phase shift function $\Phi_M(t)$ by the given function $$\Phi_M = (1-2d)\hat{\Phi}_M,$$

whereby $$\hat{\Phi}_M = \frac{\pi}{2}.$$

Further processing is known from the above explanation.

According to the present embodiment for fast changes the duty cycle d may cause a carrier amplitude level variation at the output of the switching amplifying unit 106. Slow variations may be controlled by varying the supply voltage $V_{DC}$ of the DC-DC converter 108. In more detail in the case the amplitude A is constant the high frequency part $A_H$ may be zero and the duty cycle d of the PWM signal is the average duty cycle $d_{av}$. Fast changes of the amplitude A may result in an increased or decreased duty cycle d within the allowed range $d_{max}$ to $d_{min}$. Thus a significant increased dynamic range is achieved according to the present application.

FIG. 8 shows an exemplary diagram of a run of the duty cycle depending on the high frequency part $A_H$ of the amplitude A of the signal being transmitted. Thereby the high frequency part $A_H$ is normalized. As already mentioned the maximum range of the duty cycle runs from 0 to 0.5 and the normalized amplitude signal $A_H$ runs from 0 to 1. As may be seen from FIG. 8 the slope of the amplitude for a large duty cycle is very low which increases the number of quantization bits. A restricted number of quantization bits may result into a limitation of the duty cycle. Thus $d_{max}$ can be determined by $d_{max}$=0.45 according to this embodiment.

The minimum duty cycle $d_{min}$ can be set to $d_{min}$=0.05 due to the physical limitation of the switching amplifying unit 106. However, limiting the signal may also be omitted or other boundaries can be chosen according to other or same criteria. Assuming a duty cycle range from $d_{min}$ to $d_{max}$ which may be achieved by the arranged limiting unit 704 results in the following minimum and maximum amplitude values $$A_{min} = \frac{2}{\pi}\sin(d_{min}\pi) = 0,1$$

and $$A_{max} = \frac{2}{\pi}\sin(d_{max}\pi) = 0,629.$$

The achieved corresponding normalized amplitude values are $$A_{HL} = \frac{\pi}{2}A_{min} = 0,156$$

and $$A_{Hh} = \frac{\pi}{2}A_{max} = 0,988$$

The searched average duty cycle $d_{av}$ can be obtained depending on the average normalized amplitude value $A_{av}$=0.572 and is given by $$d_{av} = \frac{1}{\pi}\arcsin(A_{av}) = 0,194.$$

The great maximum dynamic range of the PWM modulation according to the present example can also be calculated and is given by $$20\log\frac{A_{Hh}}{A_{Hl}} = 16,01 \text{ dB}.$$

What is more, it is found according to the present application that the linearity of the transmitter can be improved by applying a feedback loop. In general an implementation of a short or a long feedback loop is possible.

Figure 9:
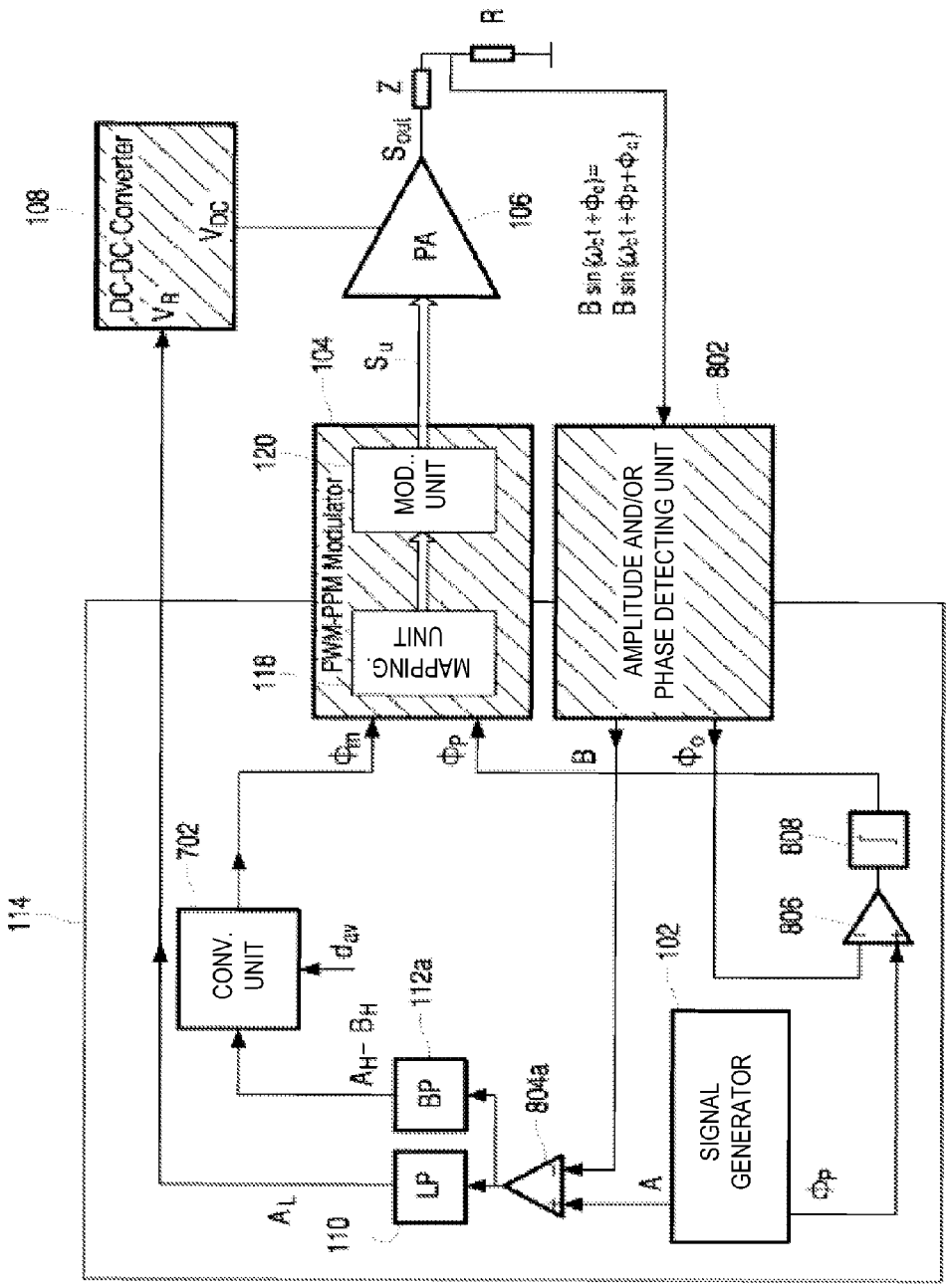
FIG. 9 a third embodiment of the apparatus according to the application comprising a long feedback loop.

FIG. 9 shows a third embodiment of the apparatus according to the application comprising a long feedback loop. The shown apparatus comprises the known units holding the same reference signs, like PWM-PPM modulating unit 104, converting unit 702, filtering units 110, 112a, signal generator 102, switching amplifying unit 106 and DC-DC converter 108.

The apparatus depicted in FIG. 9 further comprises an amplitude and/or phase detecting unit 802. In addition, a first comparing unit 804a and a second comparing unit 806 are arranged within the digital domain 114 at the two outputs of the amplitude and/or phase detecting unit 802. For example, the used comparing units 804a, 806 are comparators or similar devices. Finally an integrator unit 808 is also arranged within the digital domain 114 following the second comparing unit 806.

At the output of the switching amplifying unit 106 the amplified signal $$s_{out}=B\sin(\omega_C t+\Phi_0)=B\sin(\omega_C t+\Phi_P+\phi_e)$$

is impressed. The signal $S_{out}$ may offer an error in amplitude and phase. Signal $S_{out}$ may be fed to the amplitude and/or phase detecting unit 802. The amplitude and/or phase detecting unit 802 determines according to the present embodiment both the amplitude B and the phase $\Phi_0$ of the amplified signal $S_{out}$ and converts also both components into digital factors, and functions, respectively. However, it is also possible to detect only one component of the amplified signal $S_{out}$.

The determined amplitude component B is fed to the first comparing unit 804a and is compared with the amplitude A of the signal, in particular of the polar signal, resulting in an error signal from which the filtered low frequency part can be used to control the supply voltage $V_{DC}$ of the switching amplifying unit 106 by the DC-DC converter 108.

The filtered high frequency part of the amplitude error signal $A_H$-$B_H$ is fed to the converting unit 702 for further processing according to the above mentioned method. Both the high and low frequency parts are obtained using the arranged filtering units 110, 112a.

The determined phase component $\Phi_0$ is fed to the second comparing unit 806 and is compared with the phase component $\Phi_P$ of the generated polar signal. The resulting difference is then forwarded to the integrator unit 808 which is configured to correct the phase component $\Phi_P$. Both corrected phase component $\Phi_P$ and corrected phase shift function $\Phi_M$ are then fed to the PWM-PPM modulating unit 104. The present architecture yields to an improved linearity of the transmitter for suppressing unwanted noise.

Figure 10:
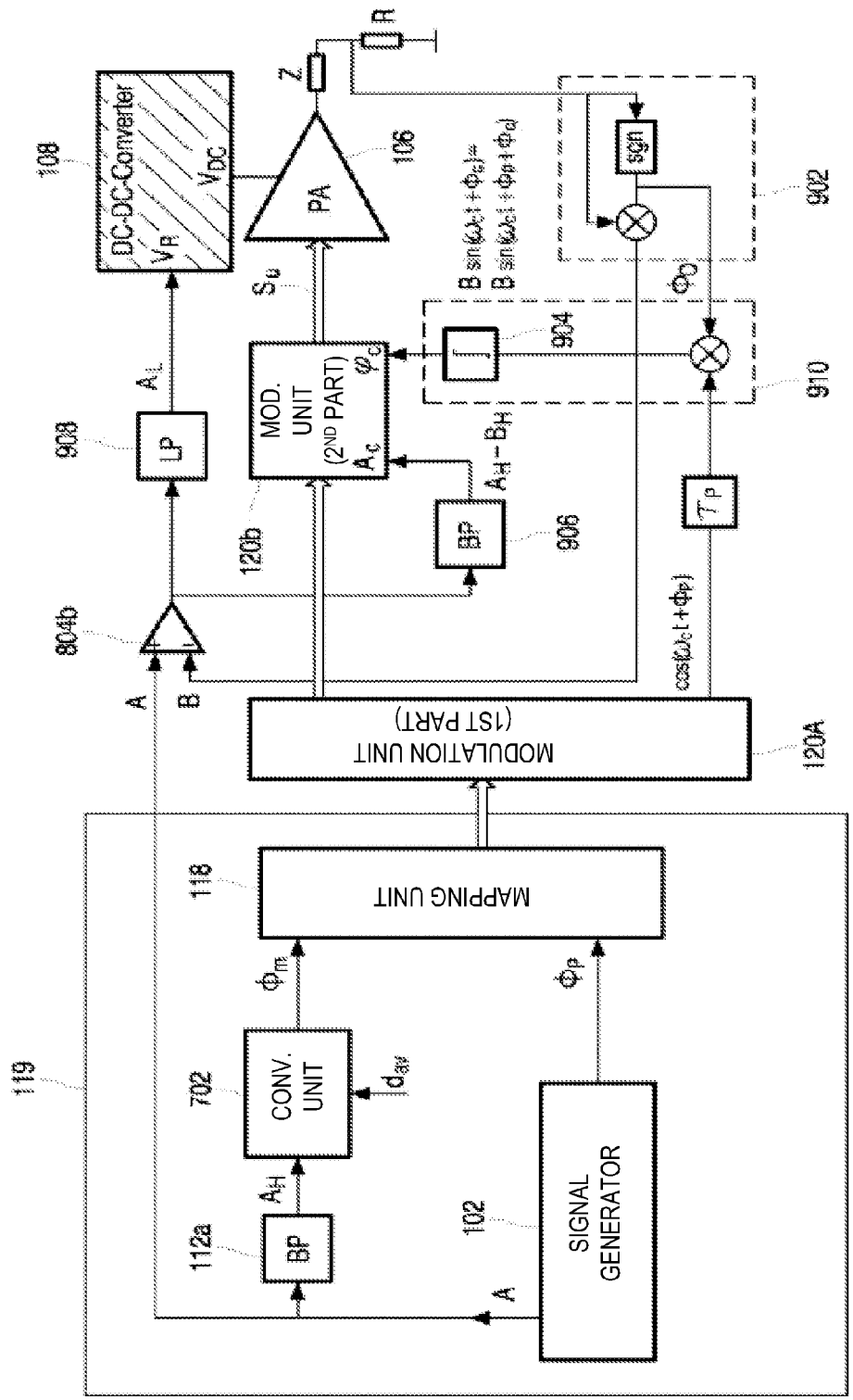
FIG. 10 a fourth embodiment of the apparatus according to the application comprising a short feedback loop.

Another possibility to implement a feedback loop is depicted in FIG. 10. FIG. 10 shows a fourth embodiment of the apparatus according to the present application comprising a short feedback loop. This short feedback loop is only implemented within the analogue domain 116.

The already known units are not mentioned again and hold also the same reference signs. Only the depicted PWM-PPM modulating unit 104 is shortly explained. The PWM-PPM modulating unit 104 is split into three parts. The known mapping unit 118 is arranged within the digital domain 114. The modulating unit 120 is divided into a first part 120a and a second part 120b. The first part 102a may comprise mixers and at least one voltage control oscillator (VCO). The second part 120b may comprise the already known implementation of a PWM-PPM modulator according to FIG. 5 without the components of the first part 120a.

Furthermore, an amplitude and/or phase detecting unit 902 is arranged comprising a signum operator and a multiplying unit. The amplitude and/or phase detecting unit 902 differs from the amplitude and/or phase detecting unit 802 in that the unit 902 is an entire analogue module.

What is more, a comparing unit 804b, for instance a comparator, is arranged as well as a low pass filtering unit 908 and an additional band pass filtering unit 906. Within the phase path of the feedback loop a phase error signal obtaining unit 910 comprising a multiplying unit and an integrator unit 904 is arranged.

The amplitude component B of the amplified signal $S_{out}$ detected by the amplitude and/or phase detector 902 is fed to the comparing unit 804b. The measured signal B and the generated amplitude component A of the polar signal are compared and the low frequency component $A_L$ determined by the low pass filtering unit 908 is used to drive the switching amplifying unit 106 in already explained manner.

The high frequency part of the amplitude error signal $A_H$-$B_H$ determined by the band pass filtering unit 906 is fed to the second part 120b of the modulating unit 120 for correcting the pulse width of the PWM-PPM modulating unit 104. According to this embodiment the high frequency part $A_H$ is corrected after obtaining the phase shift function $\Phi_M(t)$, e.g. the phase shift function $\Phi_M(t)$ is corrected. The arranged second part 120b of the modulating unit 120 is suited to perform this correction.

The detected phase component $\Phi_O$ is multiplied with the phase of the phase position modulated carrier frequency. The resulting error signal is fed to the integrator unit 904 configured to correct the phase. The result is forwarded to the second part 120b of the modulating unit 120.

The advantage of the above elucidated short feedback loop is that it is implemented totally within the analogue domain 116 which may result in a greater bandwidth.

The application has been described above by means of exemplary embodiments. It should be noted that there are alternative ways and variations which are obvious to a skilled person in the art and can be implemented without deviating from the scope and spirit of the appended claims.

Furthermore, it is readily clear for a skilled person that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. An apparatus comprising:
   a signal generator configured to generate a signal,
   a first filtering unit configured to filter a low frequency part of the signal,
   a second filtering unit configured to filter a high frequency part of the signal,
   a pulse width modulating unit configured to modulate the filtered high frequency part of the signal, and
   a DC-DC converter configured to convert the filtered low frequency part of the signal.

2. The apparatus according to claim 1, wherein the signal generator is configured to generate a polar signal.

3. The apparatus according to claim 2, wherein the first filtering unit and the second filtering unit are configured to filter an amplitude component of the polar signal.

4. The apparatus according to claim 2, wherein the pulse width modulating unit comprises a pulse position modulating unit configured to process a phase component of the polar signal.

5. The apparatus according to claim 1, further comprising an amplifying unit configured to amplify the modulated signal.

6. The apparatus according to claim 5, wherein the amplifying unit is a switching power amplifier.

7. The apparatus according to claim 5, wherein the DC-DC converter is configured to drive the amplifying unit.

8. The apparatus according to claim 5, further comprising a feedback loop path configured to correct the signal depending on an amplified signal.

9. The apparatus according to claim 8, further comprising an amplitude and/or phase detector unit arranged at the output of the amplifying unit for detecting an amplitude component and/or phase component of the amplified signal.

10. The apparatus according to claim 8, further comprising a first comparing unit configured to compare the detected amplitude component with the amplitude component generated by the signal generator.

11. The apparatus according to claim 8, further comprising a second comparing unit configured to compare the detected phase component with the phase component generated by the signal generator.

12. The apparatus according to claim 11, further comprising an integrator unit for correcting the phase component depending on the compared phase signal by the second comparing unit.

13. The apparatus according to claim 8, further comprising a phase error signal obtaining unit wherein the phase error signal obtaining unit comprises a multiplying unit and an integrator unit.

14. The apparatus according to claim 5, wherein the amplifying unit is a class D or class E amplifier.

15. The apparatus according to claim 1, wherein the pulse width modulating unit comprises a converting unit configured to determine a phase shift function depending on the filtered high frequency part of the signal.

16. The apparatus according to claim 15, wherein the converting unit comprises a clipping unit.

17. The apparatus according to claim 15, wherein the converting unit comprises a first determining unit configured to determine a first duty cycle function depending on the filtered high frequency part of the signal.

18. The apparatus according to claim 17, wherein the converting unit comprises an addition unit configured to determine a second duty cycle function depending on the first duty cycle function and an average duty cycle factor.

19. The apparatus according to claim 18, wherein the converting unit comprises a second determining unit configured to determine the phase shift function depending on the second duty cycle function.

20. The apparatus according to claim 1, wherein the pulse width modulating unit comprises a mapping unit configured to map the phase shift function and/or the phase component of the signal to at least one suitable function according to a chosen implementation of the pulse width modulating unit.

21. The apparatus according to claim 1, wherein the pulse width modulating unit comprises a modulating unit configured to generate a modulated signal.

22. The apparatus according to claim 21, wherein the modulating unit comprises at least one of:
   A) multiplying unit,
   B) addition unit,
   C) signum unit, D) NOR unit,
E) AND unit.

23. The apparatus according to claim 1, wherein the second filtering unit is at least one of:
A) high pass filter,
B) band bass filter.

24. A method comprising:
generating a signal,
filtering a low frequency part of the signal,
filtering a high frequency part of the signal,
pulse width modulating the filtered high frequency part of the signal, and
converting the filtered low frequency part of the signal.

25. A non-transitory computer readable medium having a computer program stored thereon, the computer program comprising: instructions operable to cause a processor to:
generate a signal,
filter a low frequency part of the signal,
filter a high frequency part of the signal,
pulse width modulate the filtered high frequency part of the signal, and
convert the filtered low frequency part of the signal.

26. A transmitter comprising:
a signal generator configured to generate a signal,
a first filtering unit configured to filter a low frequency part of the signal,
a second filtering unit configured to filter a high frequency part of the signal,
a pulse width modulating unit configured to modulate the filtered high frequency part of the signal, and
a DC-DC converter configured to convert the filtered low frequency part of the signal.

* * * * *